United States Patent
Kajiwara et al.

(10) Patent No.: US 7,300,302 B2
(45) Date of Patent: Nov. 27, 2007

(54) AC ADAPTER WITH HEAT RADIATION SHEET

(75) Inventors: Terutomo Kajiwara, Iizuka (JP); Dai Sasaki, Iizuka (JP); Shuji Wakafuji, Iizuka (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/408,523

(22) Filed: Apr. 21, 2006

(65) Prior Publication Data

US 2007/0002597 A1 Jan. 4, 2007

(30) Foreign Application Priority Data

Jun. 30, 2005 (JP) .............................. 2005-192403

(51) Int. Cl.
*H01R 13/00* (2006.01)
(52) U.S. Cl. ...................................... 439/485; 361/704
(58) Field of Classification Search ................ 439/485, 439/638; 363/146, 147; 361/704
See application file for complete search history.

(56) References Cited

U.S. PATENT DOCUMENTS

| | | | | | |
|---|---|---|---|---|---|
| 4,722,022 | A | * | 1/1988 | Myers et al. | 361/818 |
| 5,019,767 | A | * | 5/1991 | Shirai et al. | 320/112 |
| 5,726,858 | A | * | 3/1998 | Smith et al. | 361/705 |
| 6,445,568 | B1 | * | 9/2002 | Baur et al. | 361/600 |
| 6,776,650 | B2 | * | 8/2004 | Cheng et al. | 439/485 |
| 6,977,815 | B2 | * | 12/2005 | Hsu | 361/704 |
| 7,109,413 | B2 | * | 9/2006 | Chen | 174/50 |
| 2004/0008532 | A1 | * | 1/2004 | Asawa | 363/147 |

* cited by examiner

*Primary Examiner*—Neil Abrams
(74) *Attorney, Agent, or Firm*—Ladas and Parry LLP

(57) ABSTRACT

An AC adapter has a synthetic resin case, a switching regulator circuit assembly with an AC input terminal in the synthetic resin case, a synthetic resin name plate, and a metallic Bsheet for heat radiation separate from the resin name plate. A surface of the case has a first concave portion for the name plate and a second concave portion for the metallic sheet in the first concave portion, the metallic sheet being attached in the second concave portion with the name plate attached in the first concave portion and covering the attached metallic sheet.

8 Claims, 6 Drawing Sheets

AC ADAPTER WITH HEAT RADIATION SHEET

BACKGROUND OF THE INVENTION

1. Field of the Invention

The present invention relates to an AC adapter for a portable device.

2. Description of the Related Art

FIG. 1 is a perspective view showing a conventional AC adapter 1 with an AC cord. The AC adapter 1 includes a switching regulator circuit embedded in a synthetic resin case 4 prepared by combining a lower half case 2 with an upper half case 3. An AC cord 11 having an AC plug 10 at a tip thereof extends from one side of the case 4 and a DC cord 21 having a plug 20 at a tip thereof extends from the other side of the case 4. And a name plate 22 is attached to a surface of the case 4.

The name plate 22 includes a synthetic resin sheet in a front surface thereof and an aluminum sheet portion 23 for diffuse radiation in the whole area of a back surface thereof. The name plate 22 has substantially the same size as that of the surface of the case 4. The aluminum sheet portion 23 covers substantially the whole area of the surface of the case 4.

The AC adapter 1 is used by inserting the AC plug 10 into an outlet and connecting the plug 20 to a portable device. A noise is generated in each on/off operation repeatedly performed by a switching regulator circuit. Such a noise may be partially transmitted to the AC plug 10 via the AC cord 11. The noise transmitted via the AC cord 11 is referred to as "noise terminal voltage". This noise terminal voltage is transmitted to other electronic devices via the outlet and home wiring and affects the electronic devices connected to other outlets. Thus, it is preferable to reduce the noise terminal voltage in the AC adapter 1 as much as possible.

In the conventional AC adapter 1, the aluminum sheet portion 23 covers substantially the whole area of the surface of the case 4 and a portion of the aluminum sheet portion 23 reaches a portion for an AC input terminal to which the AC cord 11 is connected.

In FIG. 2, line I indicates the result of measurement of noise terminal voltage in the conventional AC adapter 1 using a spectrum analyzer and a receiver. The horizontal axis indicates frequency and the vertical axis indicates noise levels. As the test conditions, Vin is 120V/60 Hz and Io is 2A. In FIG. 2, line II indicates an average noise terminal voltage (AV) determined by the standards and line III indicates a quasi peak value (QP) of a peak noise terminal voltage.

As shown in FIG. 2, although the noise terminal voltage meets the standards, a margin thereof, such as a margin M relative to the peak noise terminal voltage is relatively small.

Accordingly, in the AC adapter, it is required to enlarge the aforementioned margin by further reducing the noise terminal voltage in order to improve the quality of the AC adapter.

SUMMARY OF THE INVENTION

In light of such requirement, the present invention has been made.

It is a general object of the present invention to provide an improved and useful AC adapter in which the above-mentioned problem is eliminated.

A more specific object of the present invention is to provide an AC adapter by which the quality thereof is improved in terms of the noise terminal voltage.

The present invention provides an AC adapter comprising: a synthetic resin case; a switching regulator circuit assembly having an AC input terminal and a DC output terminal, the switching regulator circuit assembly being housed in the synthetic resin case; a synthetic resin name plate; and a metallic sheet for heat radiation separate from the resin name plate, wherein the metallic sheet is attached to a surface of the case except for a portion for the AC input terminal.

According to the present invention, the metallic sheet does not exist in the portion for the AC input terminal, so that the noise terminal voltage is not propagated to the AC input terminal via the metallic sheet. Thus, the quality of the AC adapter is improved in terms of the noise terminal voltage.

DESCRIPTION OF THE PREFERRED EMBODIMENTS

In the following, an embodiment of the present invention will be described with reference to the accompanying drawings.

Figure 3:
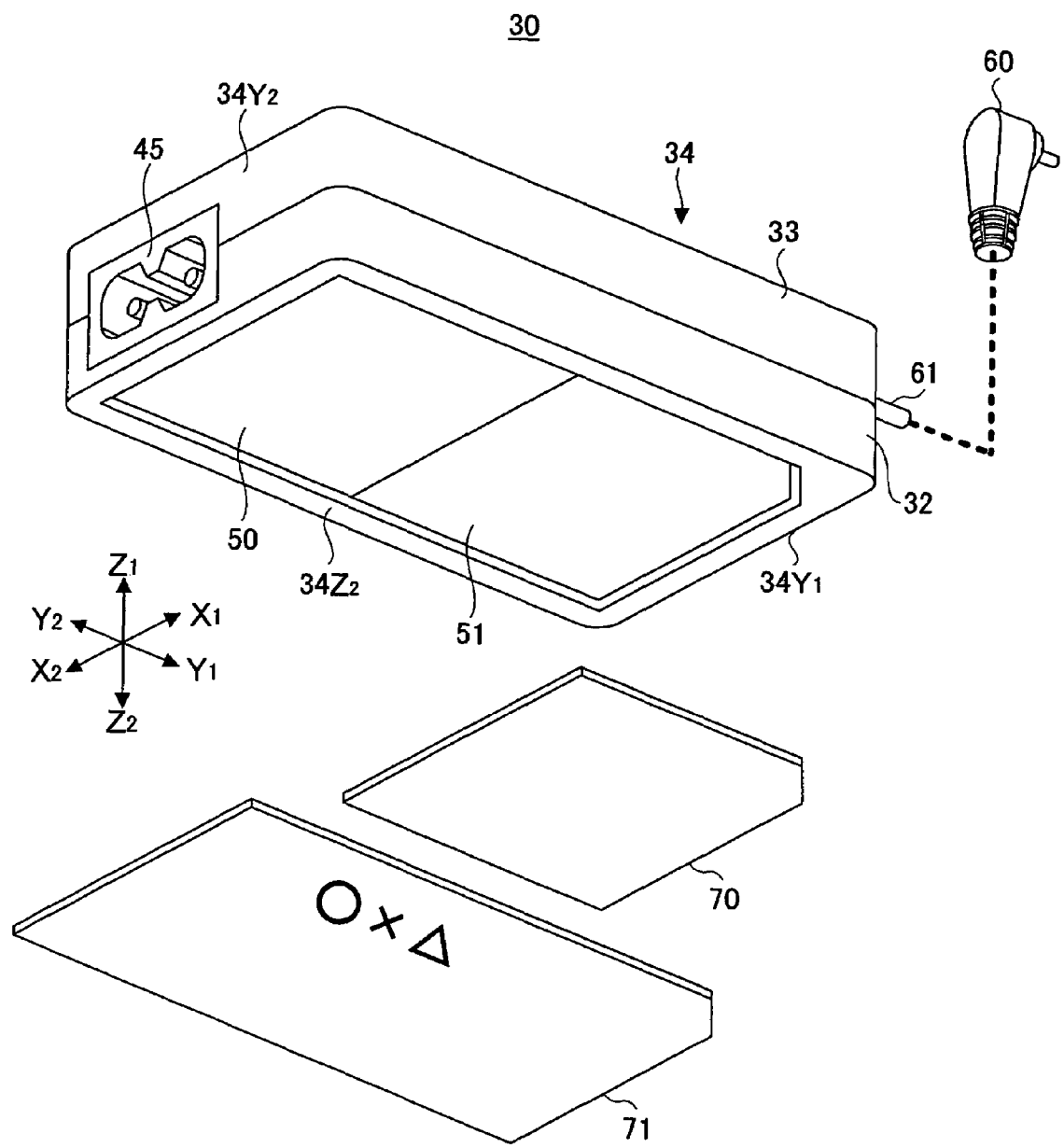
FIG. 3 is a perspective view showing an AC adapter according to an embodiment of the present invention when viewed from below, including an exploded view of an aluminum sheet and a name plate.
Figure 4:
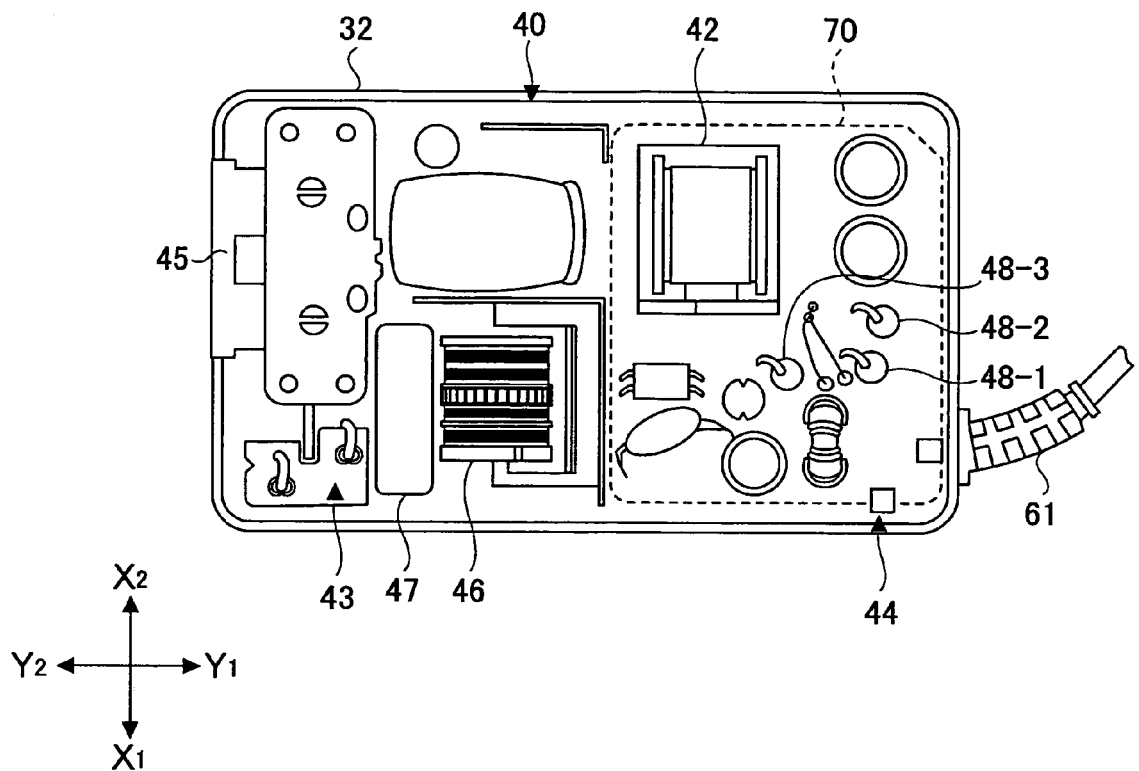
FIG. 4 is a plan view showing the AC adapter in FIG. 3 without an upper half case.
Figure 5:
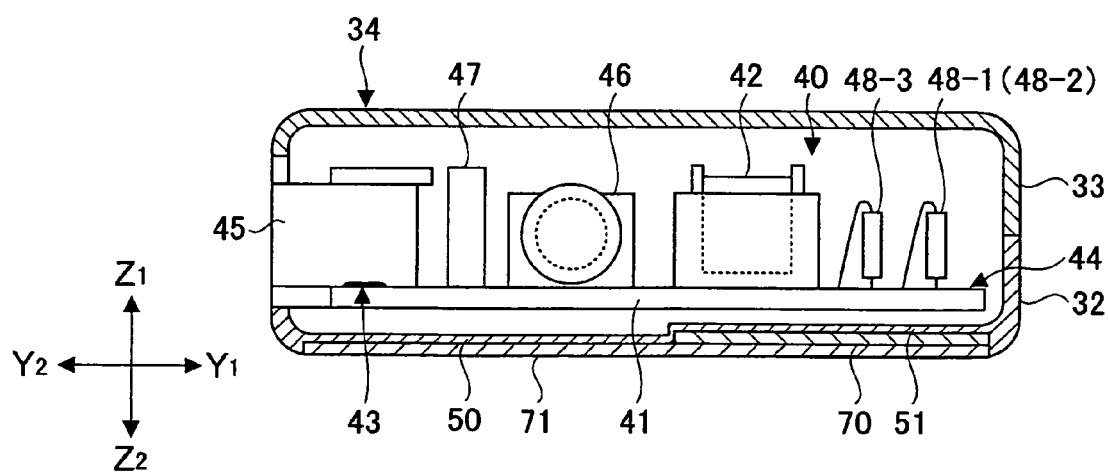
FIG. 5 is a cross-sectional view of the AC adapter in FIG. 3.

FIG. 3 is a perspective view showing an AC adapter 30 with an inlet plug for a portable device according to the embodiment of the present invention when viewed from below, including an exploded view of an aluminum sheet and a name plate. FIG. 4 is a plan view showing the inside of the AC adapter 30 without an upper half case. And FIG. 5 is a cross-sectional view of the AC adapter 30. X1-X2 indicates a width direction, Y1-Y2 indicates a longitudinal direction, and Z1-Z2 indicates a height direction.

As shown in FIGS. 3 to 5, the AC adapter 30 includes a switching regulator circuit assembly 40 embedded in a synthetic resin case 34 prepared by combining a lower half case 32 with an upper half case 33. An inlet plug 45 is exposed on a surface 34Y2 positioned on a Y2 side of the case 34, a DC cord 61 having a plug 60 at a tip thereof extends from a surface 34Y1 positioned on a Y1 side of the case 34, and an aluminum sheet 70 and a synthetic resin name plate 71 are attached to a surface 34Z2 positioned on a Z2 side of the case 34.

In the switching regulator circuit assembly 40, as shown in FIGS. 4 and 5, a transformer 42 and the like are mounted on a top surface of a printed board 41, an AC input terminal 43 is disposed on the Y2 side of the printed board 41, and a DC output terminal 44 is disposed on the Y1 side of the printed board 41. The inlet plug 45 is connected to the AC input terminal 43 and the DC cord 61 is connected to the DC output terminal 44. Further, a line filter 46 and a film capacitor 47 are mounted between the AC input terminal 43 and the transformer 42. The line filter 46 and the film capacitor 47 are configured to prevent a noise mainly generated in the transformer 42 from propagating to the AC input terminal 43, the noise being generated in each on/off operation repeatedly performed by the switching regulator circuit. Also, three Schottky diodes (SBD) 48-1, 48-2, and 48-3 are mounted between the transformer 42 and the DC output terminal 44. The Schottky diodes 48-1, 48-2, and 48-3 generate heat in particular and become main heat sources. The printed board 41 is fixed at the bottom of the lower half case 32.

A shallow concave portion 50 for the name plate 71 having a size in accordance with the size of the name plate 71 is formed on the whole area of the surface 34Z2 positioned on the Z2 side of the case 34 and a deep concave portion 51 for the aluminum sheet 70 having a size in accordance with the size of the aluminum sheet 70 is formed on a portion of the Y1 side having about a half of the whole area. The concave portion 51 has steps relative to the surface 34Z2 and the concave portion 50.

(Regarding the Aluminum Sheet 70)

The aluminum sheet 70 is a separate member having a thickness of 50 μm and a size of substantially the half of the surface 34Z2 of the case 34. The aluminum sheet 70 is positioned and attached in accordance with the concave portion 51. As shown in FIG. 5, the aluminum sheet 70 is placed within the concave portion 51. Also, as shown in FIG. 4, the aluminum sheet 70 covers an area for the Schottky diodes 48-1, 48-2, and 48-3.

The name plate 71 has a thickness of 50 μm and positioned and attached in accordance with the concave portion 50. As shown in FIG. 5, the name plate 71 is placed within the concave portion 50 and covers the aluminum sheet 70. A surface of the attached name plate 71 is flat and equal to the surface 34Z2.

The aluminum sheet 70 is not extended to a portion for the line filter 46, the film capacitor 47, and the AC input terminal 43. The aluminum sheet 70 does not exist beneath the line filter 46 to the AC input terminal 43. Thus, although the noise generated in each on/off operation repeatedly performed by the switching regulator circuit is propagated in the aluminum sheet 70, the propagation is restricted to a portion positioned substantially on the Y1 side relative to the AC input terminal 43. The noise propagated in the aluminum sheet 70 is prevented from reaching the inlet plug 45 via the AC input terminal 43. In other words, the "noise terminal voltage" resulting from the aluminum sheet 70 is not generated.

In addition, if the name plate 71 is integrated with the aluminum sheet 70, it is difficult to manufacture the name plate 71 since the size of the aluminum sheet 70 is different from that of the name plate 71. In the present embodiment, the aluminum sheet 70 is a separate member, so that it is easy to manufacture the name plate 71.

(Characteristics and the Like of Noise Terminal Voltage in the AC Adapter 30)

Figure 1:
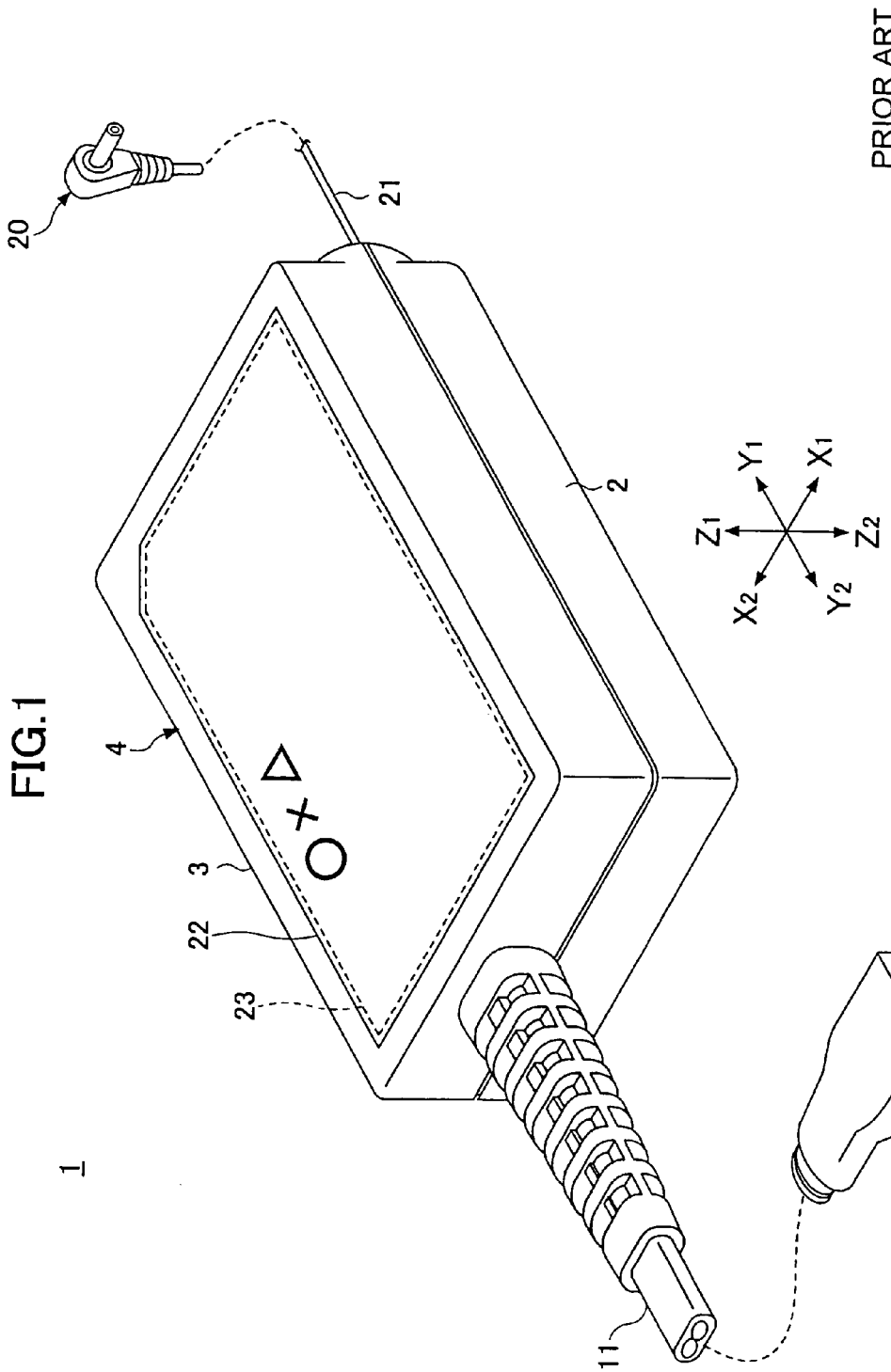
FIG. 1 is a perspective view showing a conventional AC adapter having a name plate on a top surface thereof.
Figure 2:
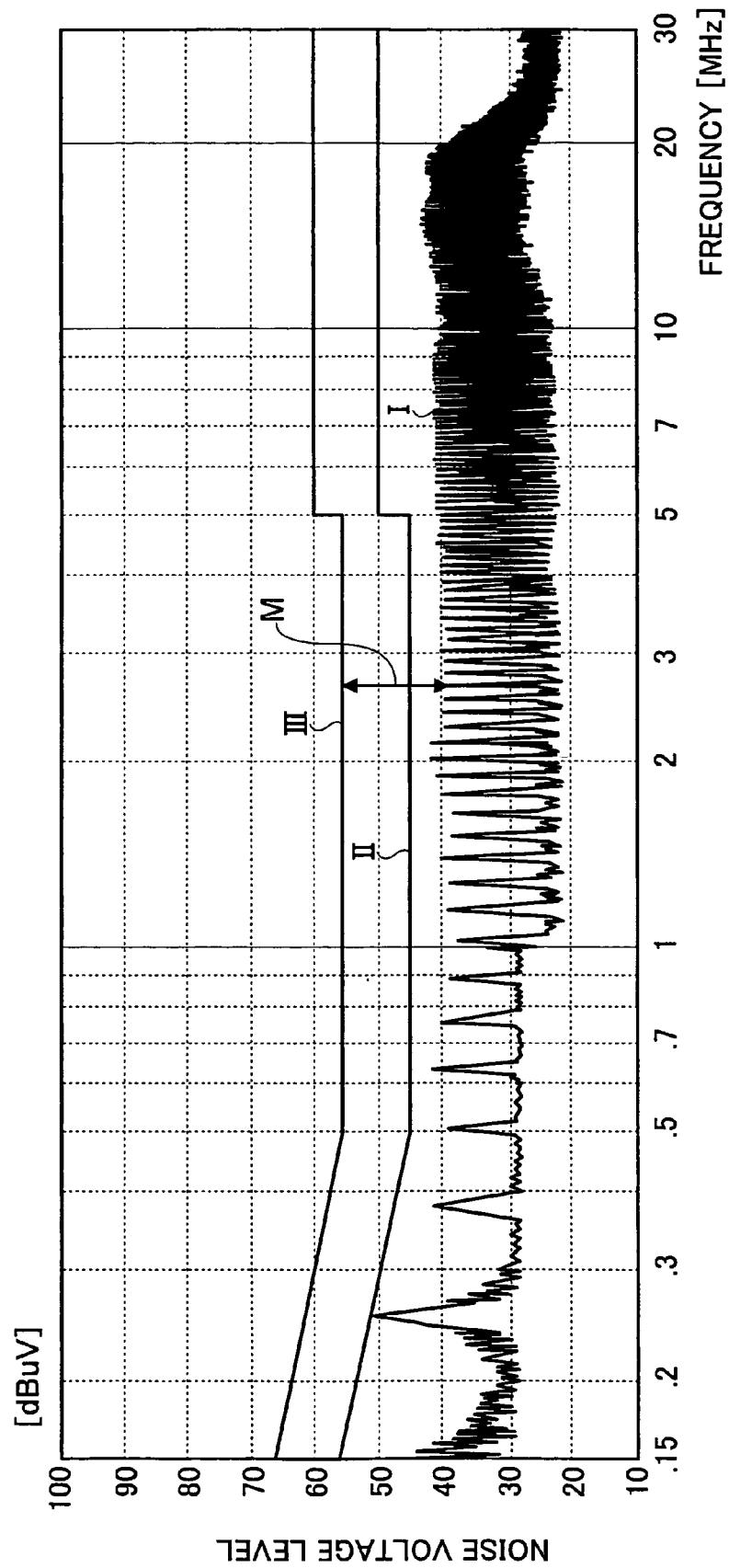
FIG. 2 is a chart showing the generation of noise terminal voltage in the conventional AC adapter in FIG. 1.
Figure 6:
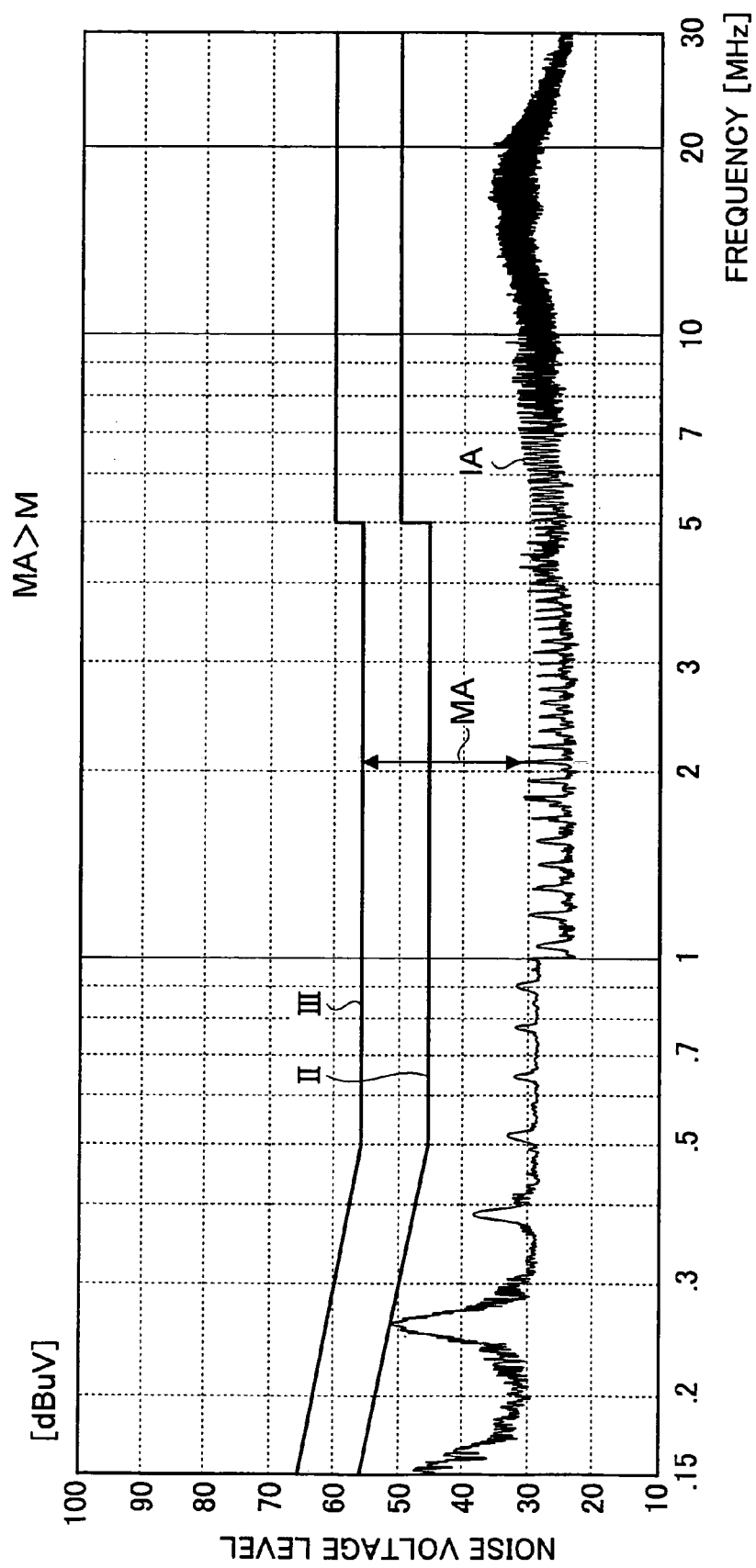
FIG. 6 is a chart showing the generation of noise terminal voltage in the AC adapter in FIG. 3.

In FIG. 6, line IA indicates noise terminal voltage in the aforementioned AC adapter 30 measured using the same test conditions mentioned above. As shown in FIG. 6, a margin MA is enlarged and MA>M in comparison with FIG. 2.

Figure 7:
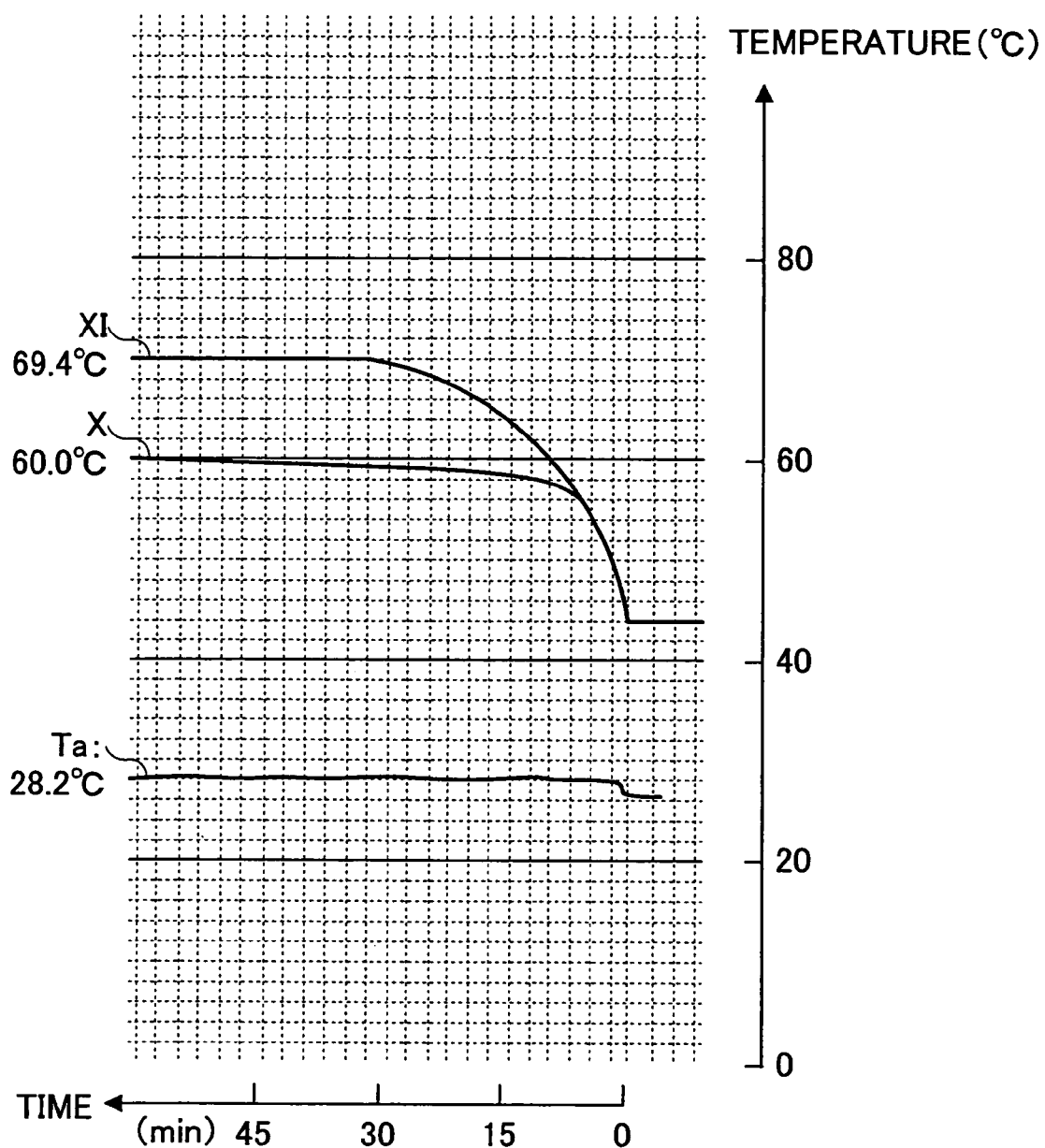
FIG. 7 is a chart showing the characteristics of heat radiation in the AC adapter in FIG. 3.

In FIG. 7, line X indicates the result of measuring the temperature of a portion of the aluminum 70 for lower portions of the Schottky diodes 48-1, 48-2, and 48-3 when the AC adapter 30 is used in an environment where ambient temperature Ta is about 28 degrees, Vin is 120V/50 Hz, and Io is 2A. Line XI indicates the result of measuring the temperature of a portion of the bottom of the lower half case 32 for lower portions of the Schottky diodes 48-1, 48-2, and 48-3 when the test is conducted without attaching the aluminum sheet 70.

After 60 minutes has elapsed, when the aluminum sheet 70 is not attached, the temperature reaches 69.4° C. and the difference of temperature ΔT from the ambient temperature Ta is 41.2° C. By contrast, when the aluminum sheet 70 is attached, the increase of the temperature is limited to 60° C. and the difference of temperature ΔT from the ambient temperature Ta is controlled to 31.8° C., thereby reducing the difference of temperature ΔT by about 10° C. in comparison with the case where the aluminum sheet 70 is not attached. In other words, although the size of the aluminum sheet 70 is substantially a half of that of the surface 34Z2 of the case 34, the aluminum sheet 70 is capable of radiating heat in a diffuse manner.

The size and arrangement of the aluminum sheet 70 are not limited to the aforementioned size and arrangement. The aluminum sheet 70 has certain effects when an end thereof is distanced from the AC input terminal 43.

The structure of the aluminum sheet 70 attached as mentioned above can be applied to an AC adapter with an AC cord and the same effects are obtained.

The present invention is not limited to the specifically disclosed embodiment, and variations and modifications may be made without departing from the scope of the present invention.

The present application is based on Japanese priority application No. 2005-192403 filed Jun. 30, 2005, the entire contents of which are hereby incorporated herein by reference.

What is claimed is:

1. An AC adapter comprising:
    a synthetic resin case;
    a switching regulator circuit assembly having an AC input terminal and a DC output terminal, the switching regulator circuit assembly being housed in the synthetic resin case;
    a synthetic resin name plate; and
    a metallic sheet for heat radiation separate from the resin name plate,
    wherein the metallic sheet is attached to a surface of the case without overlapping the AC input terminal,
    wherein the case includes, on the surface thereof, a first concave portion for the name plate and a second concave portion for the metallic sheet,
    wherein the second concave portion for the metallic sheet is in the first concave portion for the name plate and is deeper than the first concave portion for the name plate, and
    wherein the metallic sheet is attached in the second concave portion for the metallic sheet, and the name plate is attached in the first concave portion for the name plate and covering the attached metallic sheet.

2. The AC adapter according to claim 1 wherein the first concave portion for the name plate has a form in accordance with the name plate.

3. The AC adapter according to claim 2 wherein a depth of the first concave portion for the name plate is substantially equal to a thickness of the name plate.

4. The AC adapter according to claim 2 wherein the second concave portion for the metallic sheet has a form in accordance with the metallic sheet.

5. The AC adapter according to claim 4 wherein a depth of the second concave portion for the metallic sheet is substantially equal to a thickness of the metallic sheet.

6. The AC adapter according to claim 1 wherein the metallic sheet has a size smaller than that of the name plate and is attached on the DC output terminal side.

7. The AC adapter according to claim 2 wherein the metallic sheet has a size smaller than that of the name plate and is attached on the DC output terminal side.

8. The AC adapter according to claim 4 wherein the metallic sheet has a size smaller than that of the name plate and is attached on the DC output terminal side.

* * * * *